United States Patent [19]
Foss

[11] Patent Number: 5,822,333
[45] Date of Patent: Oct. 13, 1998

[54] DIGITAL MEMORY TESTING METHOD

[75] Inventor: Richard C. Foss, Kirkcaldy Fife, Great Britain

[73] Assignee: Mosaid Technologies Incorporated, Kanata, Canada

[21] Appl. No.: 624,213

[22] Filed: Mar. 29, 1996

[51] Int. Cl.$^6$ ..................................................... G06F 11/00
[52] U.S. Cl. ........................................................ 375/21.2
[58] Field of Search .................................. 371/21.2, 21.1, 371/21.3, 21.4, 22.5, 22.6, 24

[56] References Cited

U.S. PATENT DOCUMENTS

| 4,942,576 | 7/1990 | Busack et al. | 371/21.2 |
| 5,222,066 | 6/1993 | Grula et al. | 371/21.2 |

*Primary Examiner*—Vincent P. Canney
*Attorney, Agent, or Firm*—E. E. Pascal; R. A. Wilkes

[57] ABSTRACT

A method of testing a digital memory comprised of bit storage locations, comprising writing a bit to a first bit storage location, then driving the stored bit sequentially through a plurality of the bit storage locations, reading a last bit storage location of the plurality of bit storage locations, and testing a bit read from the last bit storage location.

11 Claims, 1 Drawing Sheet

DIGITAL MEMORY TESTING METHOD

FIELD OF THE INVENTION

This invention relates to a method of testing semiconductor digital memories.

BACKGROUND TO THE INVENTION

Semiconductor digital memories such as dynamic random access memories (DRAMs) have been constantly increasing in bit storage capacity, and as this increases, the parallel input/output bus size increases. For example, in 16 megabit DRAM bit density, an input/output (I/O) bus 16 bits wide has been used, each line of the bus accessing 1 megabits. Thirty two bit wide I/O buses are being standardized, and sixty four bit wide I/O buses are increasingly attractive.

Production testing of such memories presents a problem, because the cost of I/O channels in memory testers is a significant part of the cost of the testers, and in the interest of speed, testers frequently are set up to test memory chips in parallel. Increasing the data width thus increases test costs.

SUMMARY OF THE PRESENT INVENTION

The present invention is a method of testing digital memories of any data (i.e. I/O bus) width, using only a standard memory tester, with as few as only a single I/O channel.

In accordance with the present invention, a method of testing a digital memory comprised of bit storage locations, is comprised of the steps of writing a bit to a first bit storage location, then driving the stored bit sequentially through a plurality of the bit storage locations, reading a last bit storage location of the plurality of bit storage locations, and testing a bit read from the last bit storage location.

In accordance with another embodiment, a method of testing a digital memory comprising bit storage locations, is comprised of the steps of writing a bit to each of a group of bit storage locations in parallel, subsequently reading all of the bit storage locations in parallel through buffers associated with respective bit storage locations, and detecting power supply current flow to the buffers resulting from a difference in bits read through the buffers.

In accordance with another embodiment, a digital memory is comprised of bit memory locations and I/O pins in communication with the bit memory locations, and switches operable by control signals connecting successive pairs of the I/O pins together. The memory can be a DRAM, and the switches can be field effect transistors each having a source and drain circuit connected to a corresponding pair of the I/O pins, and a gate for receiving one of the control signals.

BRIEF INTRODUCTION TO THE DRAWINGS

A better understanding of the invention will be obtained by considering the detailed description below, with reference to the following drawings, in which:

FIG. 1 is a schematic diagram of a preferred embodiment of the invention.

DETAILED DESCRIPTION OF THE PREFERRED EMBODIMENTS

Figure 1:
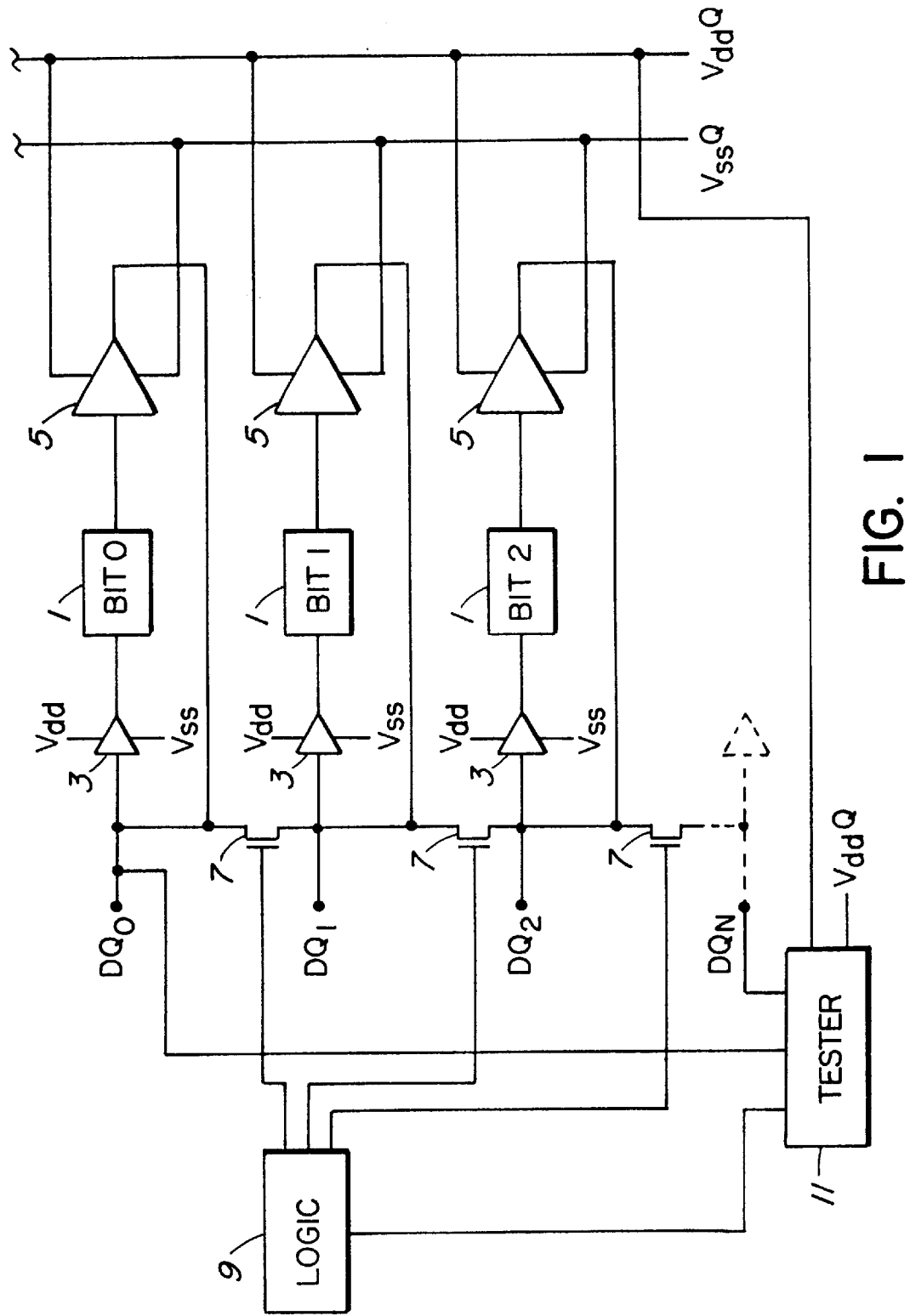

A digital memory such as a DRAM is comprised of bit storage locations 1, for storing bits shown as BIT 0, BIT 1, BIT 2 and extends to BIT N (not shown). In a DRAM each bit storage location is comprised of storage cells accessed via bit lines and word lines, in a well known manner. The DRAM is also addressed in a well known manner. Each bit storage location is written to via an input buffer 3 which is powered from voltage rails Vdd and Vss, and which has its input connected to an I/O pin, respectively DQ0, DQ1, DQ2 . . . DQN.

Bits stored in the bit storage locations are read via output buffers 5, which buffers have their outputs connected to their respective I/O pins DQ0, DQ1, DQ2 . . . DQN. It should be noted that the use of the word "pin" is for convenience, and is intended to include any conductive structure for providing data to and obtaining data from, the bit storage locations.

In a DRAM, the input buffer 3 is typically comprised of a latch, strobed at a /RAS (row address strobe) time, and subsequently responding to a /CAS (column address strobe). Separate row address and column address latches may be used.

All such ancillary structures, including input and output buffers, should be construed to be within the meaning of bit storage locations.

In wide bus (i.e. wide data word) memories, separate power rails are often provided for one or both of VssQ and VddQ, voltages which are applied to the buffers 5. These power pins are separate from the main power supply pins in order to reduce noise from output buffers passing into the power rails from interfering with memory operation. In an embodiment of the invention to be described below, the power rails VssQ and VddQ are isolated from the main memory power rails Vdd and Vss.

In accordance with the present invention, individual switches, preferably being comprised of field effect transistors (FETs) 7 as shown in FIG. 1, are connected between each of the I/O pins DQ0, DQ1, DQ2, etc. In the embodiment shown in FIG. 1, the source-drain circuits of the FETs are connected between corresponding I/O pins. The gates of FETs 7 (or the control of the switches they represent) are connected to a logic circuit 9. Logic circuit 9 applies a logic level signal to all of the gates of FETs 7 together, in accordance with an embodiment to be described below, or applies a logic level signal to each of the gates in sequence, in accordance with another embodiment to be described below, or applied a logic level signal to one or more gates of groups of FETs to enable conduction of the corresponding FET to accomplish selective connection together or disconnection of successive I/O pins, in accordance with the embodiments to be described below.

It is preferred that the switches should be located on-chip with the remainder of the memory. The logic 9 is also located on-chip, whereby only control signals from a tester are applied to it during a memory test mode. The logic circuit design is not described in detail in this specification, for the reason that it does not require the exercise of inventive ingenuity. For example, connecting all or a group of gates of FETs 7 together and to a source of logic signals requires merely a switch with plural inputs and a single output, easily provided by a group of FET switches. Sequential enabling of each of FETs 7 can be achieved by means of a counter.

To operate the invention a tester 11 is connected to the logic 9 and to first and last I/O pins of a group of bit storage locations. The group can be comprised of a fraction of, or the total number of bit storage locations of the memory. If the group is the fraction, testing is progressed to sequential groups until all of the bit storage locations are tested.

In operation, an optional initial test can be made for I/O pin leakage, by closing all or a group of the switches DQ0–DQN, and applying a binary 1 to an I/O input, e.g. DQ0. The tester 11 then tests current leakage through the common I/O pin connection via the DQ0 I/O pin. Only a single tester I/O channel is required for this. In a good memory, normal leakage is typically less than 10 microamperes; the tester can signify a good or a bad memory by testing against a threshold.

Alternatively, if the I/O bus is to tested in parallel, the I/O pins of each of the bit storage locations are connected together for each of the lines of the bus, a bit is applied to each of the lines, and the leakage current for each of the lines of the bus is measured by the tester. This requires only one I/O channel per line; in a 16 bit bus, 16 I/O tester channels are required; in a 32 bit bus, 32 I/O tester channels are required; in a 64 bit bus, 64 I/O channels are required.

The number of I/O channels can be reduced by checking the I/O pins in smaller groups than the total number of lines.

After the leakage test, the switches should be opened. A bit of data (e.g. a logic 1) is written by the tester 11 to an address in the BIT0 bit storage location (the address is arbitrary). The FET 7 connecting I/O DQ0 and DQ1 and is then closed under control of logic 9. In a following cycle, the bit stored in the BIT0 bit storage location is read, and in the next cycle it passes through the closed FET 7, and is written to the BIT1 bit storage location.

The FET connecting I/O pins DQ0 and DQ1 is then enabled, and the FET connecting I/O pins DQ1 and DQ2 is controlled to become nonconductive under control of logic 9. In the next cycle the bit stored in the BIT1 storage location is read, and in the following cycle it passes through the conductive FET 7 and is written to the BIT2 bit storage location.

The same sequence is repeated for all bit memory locations. The bit initially applied from the tester through DQ0 to the BIT0 bit memory location is thus driven through each of the memory locations to the last memory location, e.g. BITN. The tester reads that bit via its connection to the I/O pin DQN.

Testing can be done in this manner to all of the memory locations in the memory, or to successive groups of memory locations. Testing can be done using a logic 1 and also using a logic 0 as the test bit. External loads can be provided on the I/O pins by the tester to attempt to pull the I/O pins to low logic level during logic 1 testing, and to attempt to pull the I/O pins to high logic level during logic 0 testing.

If the input buffers have differential inputs and a voltage $V_{ref}$ setting its input trip points, as in high speed interfaces, varying $V_{ref}$ will allow separate checking of the output voltage levels.

Also, during the testing stage wherein a bit is driven sequentially through each of the bit storage locations, the voltage VddQ can be set to a lower than normal value (e.g. lower than Vdd) to check the combined input and output level 1 margin.

If the memory is bit sliced (i.e. is divided into sections, each section being comprised of a group of bit storage locations defining a multi-bit word, instead of a single bit being written by the tester to a single bit storage location, a data word is written to a group of bit storage locations comprising the section. The word is driven from section to section in a manner analogous to that described above to a final section which has a group of I/O pins. The data word read from the final bit storage locations of the final section is tested by tester 11. This embodiment presumes that the sectioning (bit slicing) of the memory is done so that there is no interaction between bits stored in each section. In this manner a simple single channel parallel test of all sections can be tested for address and data pattern integrity.

In accordance with another embodiment, all of the switches are closed, and a bit is written via an I/O pin, e.g. DQ0, by the tester to all bit storage locations in parallel. In a next cycle, the switches remain closed, and all bit storage locations are read in parallel, e.g. also via I/O pin DQ0, with no d.c. loads on any I/O pin. The data read on I/O pin DQ0 can now be checked by tester 11 against expected data. If data stored by any bit storage location should differ from that at any other bit storage location, current will flow through one or more of the switches. This current can be detected by tester 11 monitoring the current passing into the VddQ bus.

This last-described test can be done by applying the bits to groups of four or eight bit storage locations to avoid the build up of delays and drops in the switches. However all switches interconnecting the I/O pins of the bit storage locations to be tested should be "on", as in the embodiment for leakage testing.

A person understanding this invention may now conceive of alternative structures and embodiments or variations of the above. All those which fall within the scope of the claims appended hereto are considered to be part of the present invention.

I claim:

1. A method of testing a digital memory comprised of bit storage locations, comprising writing a bit to a first bit storage location, then driving said stored bit sequentially through a plurality of said bit storage locations, reading a last bit storage location of said plurality of bit storage locations, and testing a bit read from said last bit storage location, in which the step of driving is comprised of, for each pair of bit storage locations in sequence, coupling the output of a preceding bit storage location to an input of a following bit storage location, reading a bit stored in the preceding bit storage location to the following bit storage location, then decoupling the output of the preceding bit storage location from the input of the following bit storage location.

2. A method as defined in claim 1 in which the memory is comprised of sections, each being comprised of a group of bit storage locations defining a multi-bit word, said writing step being comprised of writing a data word to said group of bit storage locations, said driving step being comprised of driving said word sequentially through each section, said reading step being comprised of reading bit storage locations of a last section, said testing being comprised of testing a word read from said last section.

3. A method as defined in claim 1 in which the memory is a DRAM, and in which each bit storage location is comprised of a memory cell.

4. A method as defined in claim 1 including an output buffer associated with each bit storage location, and means for applying a voltage source having a normal operating voltage to each output buffer, and further including the step of lowering the operation voltage prior to at least one of writing and reading to the bit storage location.

5. A method of testing a digital memory comprised of bit storage locations, comprising writing a bit to a first bit storage location, then driving said stored bit sequentially through a plurality of said bit storage locations, reading a last bit storage location of said plurality of bit storage locations, and testing a bit read from said last bit storage location, and including an initial step of connecting inputs and outputs of the bit storage locations in parallel, and testing leakage currents from said inputs and outputs as an indicator of memory fault.

6. A method of testing a digital memory comprising bit storage locations, comprising the steps of writing a bit to each of a group of bit storage locations in parallel, subsequently reading all of said bit storage locations in parallel through buffers associated with respective bit storage locations, and detecting power supply current flow to said buffers resulting from a difference in bits read through said buffers.

7. A method as defined in claim 5 including connecting I/O pins of said bit storage locations in parallel during said writing step and during said reading step.

8. A method as defined in claim 6 repeated sequentially for groups of bit storage locations encompassing the entire memory.

9. A digital memory comprising bit memory locations and I/O pins in communication with the bit memory locations, and switches operable by control signals coupling successive pairs of the I/O pins together.

10. A digital memory as defined in claim 9, in which the memory is a DRAM, and in which the switches are field effect transistors each having a source and drain circuit connected to a corresponding pair of said I/O pins, and a gate for receiving one of the control signals.

11. A digital memory as defined in claim 10, in which the field effect transistors are integrated into the same chip as the DRAM.

* * * * *